United States Patent
Seo et al.

(10) Patent No.: US 10,902,922 B2
(45) Date of Patent: Jan. 26, 2021

(54) NONVOLATILE MEMORY DEVICE STORING DATA IN SUB-BLOCKS AND OPERATING METHOD THEREOF

(71) Applicant: Samsung Electronics Co., Ltd., Suwon-si (KR)

(72) Inventors: Hyun Seo, Goyang-si (KR); Kui Han Ko, Seoul (KR); Jin-Young Kim, Seoul (KR); Il Han Park, Suwon-si (KR); Bong Soon Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/412,953

(22) Filed: May 15, 2019

(65) Prior Publication Data

US 2019/0371411 A1 Dec. 5, 2019

(30) Foreign Application Priority Data

Jun. 1, 2018 (KR) ........................ 10-2018-0063282

(51) Int. Cl.
*G11C 16/16* (2006.01)
*G11C 16/08* (2006.01)

(52) U.S. Cl.
CPC .............. *G11C 16/16* (2013.01); *G11C 16/08* (2013.01)

(58) Field of Classification Search
CPC ......... G11C 16/16; G11C 16/08; G11C 29/88; G11C 16/10; G11C 16/32; G11C 16/0483
See application file for complete search history.

(56) References Cited

U.S. PATENT DOCUMENTS

| | | |
|---|---|---|
| 6,763,424 B2 | 7/2004 | Conley |
| 7,804,718 B2 | 9/2010 | Kim |
| 9,240,241 B2 | 1/2016 | Costa et al. |
| 9,324,446 B2 | 4/2016 | Hishida et al. |
| 9,595,319 B2 | 3/2017 | Lee |
| 9,620,217 B2 | 4/2017 | Lue et al. |
| 9,715,444 B2 | 7/2017 | Lee et al. |
| 2013/0138869 A1 | 5/2013 | Kwak |
| 2014/0241092 A1* | 8/2014 | Ha ....................... G11C 11/5621 365/218 |
| 2016/0217868 A1* | 7/2016 | Dutta ................... G11C 16/349 |
| 2018/0088823 A1* | 3/2018 | Ramalingam .......... G11C 29/44 |
| 2019/0304543 A1* | 10/2019 | Sule ....................... G11C 16/12 |

* cited by examiner

*Primary Examiner* — Jerome Leboeuf
(74) *Attorney, Agent, or Firm* — Harness, Dickey and Pierce, P.L.C.

(57) ABSTRACT

A nonvolatile memory includes a first sub-block defined by a first string select line and a first word line; a second sub-block defined by a second string select line different from the first string select line and a second word line different from the first word line; a first vacant block defined by the first string select line and the second word line; and a second vacant block defined by the second string select line and the first word line. First data is programmed in the first sub-block with, second data is programmed in the second sub-block, and no data is programmed in the first vacant block and the second vacant block.

19 Claims, 11 Drawing Sheets

NONVOLATILE MEMORY DEVICE STORING DATA IN SUB-BLOCKS AND OPERATING METHOD THEREOF

This application claims the benefit of Korean Patent Application No. 10-2018-0063282, filed on Jun. 1, 2018, in the Korean Intellectual Property Office, the disclosure of which is incorporated herein in its entirety by reference.

BACKGROUND

1. Field of the Disclosure

Example embodiments relate to a nonvolatile memory device and/or a method of operating the same.

2. Description of the Related Art

As a representative nonvolatile memory device, in which the stored data is maintained without disappearing even when a power supply is cut off, a flash memory may be adopted. Further, a flash memory device having a three-dimensional structure may be used in order to enhance the degree of integration. The flash memory device may include a memory cell array divided into a plurality of memory blocks.

A plurality of memory blocks of the memory cell array may operate by being classified into a memory block in which general data is stored and a memory block in which metadata is stored. For example, when the memory cell array includes n (here, n is a natural number) memory blocks, the metadata may be stored in two (2) designated memory blocks, and the general data may be stored in the n-2 designated memory blocks. Further, metadata of first type may be stored in one (1) memory block among the two (2) memory blocks in which the metadata is stored, and the metadata of a second type different from the first type may be stored in the other memory among the two (2) memory blocks. In other words, the metadata may be stored only in a predetermined memory block in which the general data is not stored, and only one kind of metadata may be stored in each of the memory blocks designated for the metadata.

As the number of string select lines and word lines of the flash memory device of three-dimensional structure increases, the size of the memory block increases. However, if the size of the metadata does not increase, according to the aforementioned method, a wasted region in the memory block in which the metadata is stored may increase.

SUMMARY

Example embodiments of the present disclosure provide a nonvolatile memory device for reducing (or, alternatively, minimizing) a wasted region in the memory block.

At least some example embodiments relate to a method of operating a nonvolatile memory device for reducing (or, alternatively, minimizing) a wasted region in the memory block.

Example embodiments are not restricted to those mentioned above but other example embodiments not mentioned is clearly understood from the description below to the those of ordinary skill in the technical field.

According to an example embodiment, there is provided a nonvolatile memory device including a first sub-block defined by a first string select line and a first word line, the first sub-block configured to store first data therein; a second sub-block defined by a second string select line and a second word line, the second string select line and the second word line being different from the first string select line and the first word line, respectively, the second sub-block configured to store second data therein; a first vacant block defined by the first string select line and the second word line; and a second vacant block defined by the second string select line and the first word line, wherein each of the first vacant block and the second vacant block are configured to not store data therein.

According to another example embodiment, there is provided a nonvolatile memory device including a control logic which controls an address decoder and a read/write logic; and a cell array including a plurality of memory blocks, the control logic configured to, program first data in a first sub-block defined in one memory block among the plurality of memory blocks, and program second data in a second sub-block defined in the one memory block such that the second sub-block does not share a string select line and a word line with the first sub-block.

According to another example embodiment, there is provided a method of operating a nonvolatile memory device including defining a first sub-block and a second sub-block in one physical block such that the second sub-block does not share a word line and a string select line with the first sub-block; programming first data in the first sub-block; and programming second data in the second sub-block.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
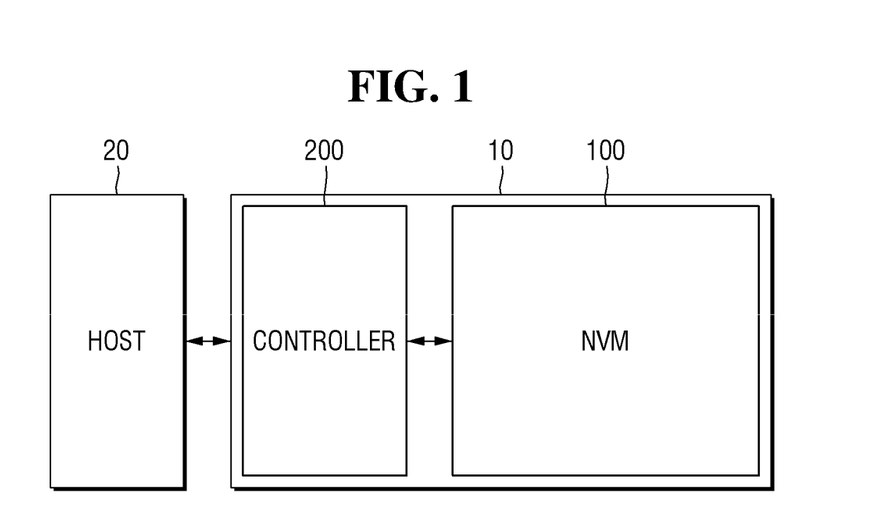
FIG. 1 is a conceptual diagram illustrating a nonvolatile memory device according to an example embodiment of the present disclosure.

FIG. 1 is a conceptual diagram illustrating a nonvolatile memory device according to an example embodiment of the present disclosure.

Referring to FIG. 1, a memory device 10 according to an example embodiment of the present disclosure includes a nonvolatile memory device 100 and a controller 200.

The memory device 10 may receive a read or write request from a host 20. The memory device 10 may further include an interface for transferring the request from the host 20 to the controller 200 and/or for providing the data, which is provided from the controller 200, to the host 20.

The controller 200 may access the nonvolatile memory device 100 in response to read or write request from the host 20. For example, the controller 200 may read the data stored in the nonvolatile memory device 100 and provide the data to the host 20 as a response to the read request. Further, the controller 200 may program the data, which is provided from the host 20, in the nonvolatile memory device 100 as a response to the write request. Further, the controller 200 may perform an erase operation on the nonvolatile memory device 100.

The controller 200 may include a flash translation layer FTL. The flash translation layer may be used for converting a logical address into a physical address. For example, the controller 200 may convert a logical address according to the read or write request received from the host 20 into a physical address of the nonvolatile memory device 100, using the flash translation layer. To this end, the controller 200 may also manage an address mapping table that stores a mapping relation between the logical address and the physical address.

Figure 2:
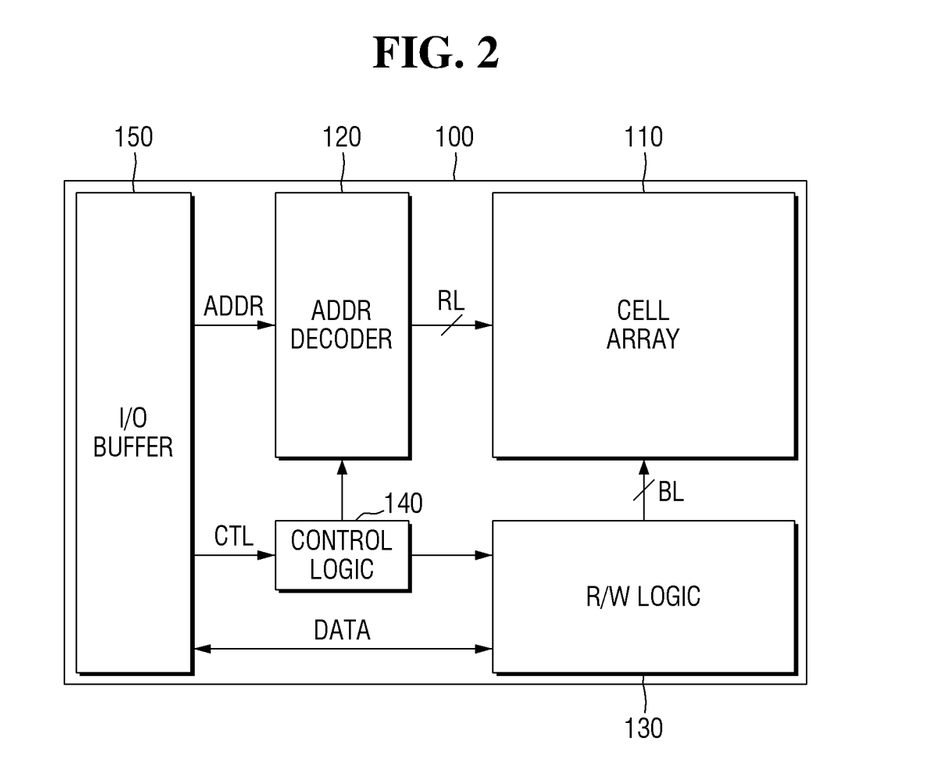
FIG. 2 is a block diagram illustrating the nonvolatile memory device according to an example embodiment of the present disclosure.

Referring now to FIG. 2, the nonvolatile memory device 100 will be described in more detail.

FIG. 2 is a block diagram illustrating the nonvolatile memory device according to an example embodiment of the present disclosure.

Referring to FIG. 2, the nonvolatile memory device 100 includes a cell array 110, an address decoder 120, a read/write logic 130, a control logic 140 and an I/O buffer 150.

The cell array 110 is connected to the address decoder 120 via a row line RL, and is connected to the read/write logic 130 via a bit line BL. Here, the row line includes a plurality of string select lines, a plurality of word lines, a plurality of ground select lines, and the like.

The address decoder 120 is connected to the cell array 110, the control logic 140 and the I/O buffer 150. The address decoder 120 receives an address ADDR via the I/O buffer 150, and decodes the received address ADDR under the control of the control logic 140. For example, the address decoder 120 decodes the received address ADDR to acquire the block address, and may access the memory block of the cell array 110, using the block address.

The address decoder 120 may further include a row decoder. The address decoder 120 may acquire the row address, by decoding the received address ADDR, using the row decoder, and may select one of a plurality of word lines selected in the cell array 110, using the row address.

Also, the address decoder 120 may further include a column decoder. The address decoder 120 may acquire the column address by decoding the received address ADDR, using the column decoder, and may transfer the column address to the read/write logic 140.

The read/write logic 130 is connected to the cell array 110 via the bit line BL and receives the column address decoded by the address decoder 120. The read/write logic 130 selects the bit line BL, under the control of the control logic 140, using the decoded column address.

For example, the read/write logic 130 may program data DATA received via the I/O buffer 150 in the memory cell corresponding to a selected word line in the cell array 110. On the other hand, the read/write logic 130 may read the data DATA corresponding to the decoded column address in the cell array 110 and transfer the data DATA to the I/O buffer 150. Further, the read/write logic 130 may also execute a copy-back operation of writing the data, which is read from the one region of the cell array 110, in another region.

The read/write logic 130 may include elements such as a page buffer, a page register, a column selection circuit, a detection amplifier, a write driver, and the like.

The control logic 140 is connected to the address decoder 120, the read/write circuit 130 and the I/O buffer 150. The control logic 140 may control the overall operation of the nonvolatile memory device 100 in accordance with a control signal CTL provided from the outside.

The I/O buffer 150 is connected to the address decoder 120, the control logic 140 and the read/write circuit 130. The I/O buffer 150 may transfer the address ADDR and the control signal CTL, which are provided from the outside, to the address decoder 120 and the control logic 140, respectively.

The I/O buffer 150 may transfer the data DATA, which is received together with the write request from the host 20, to the read/write circuit 130, or may transmit the data DATA, which is read from the host 110 by the read/write circuit 130, for example, to the host 20.

Figure 3:
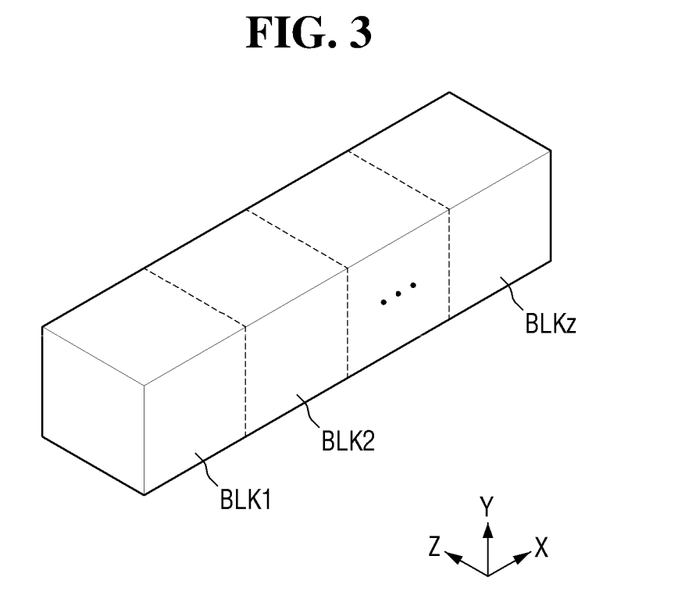
FIG. 3 is a schematic view illustrating a memory cell of a nonvolatile memory device according to an example embodiment of the present disclosure.

Referring now to FIG. 3, the cell array 110 will be described in more detail.

FIG. 3 is a schematic view illustrating a memory cell of a nonvolatile memory device according to an embodiment of the present disclosure.

The cell array 110 may include a plurality of memory blocks BLK1, BLK2, . . . , BLKz (where z is an integer of 2 or more). Each of the plurality of memory blocks BLK1, BLK2, . . . , BLKz may have a three-dimensional vertical structure. For example, each of the plurality of memory blocks BLK1, BLK2, . . . , BLKz includes a plurality of cell strings which extends along a second direction Y and is disposed along the first direction X and a third direction Z. Each of the plurality of memory blocks BLK1, BLK2, . . . , BLKz may be connected through a plurality of bit lines BL, a plurality of string select lines SSL, a plurality of word lines WL, and one or more ground select lines GSL, and more specific contents thereof will be described later with reference to FIG. 4.

In various example embodiments of the present disclosure, the plurality of memory blocks BLK1, BLK2, . . . , BLKz may include a memory block for storing the general data and a memory block for storing the metadata. For example, the memory block BLK1 and BLK2 may be designated as blocks in which the metadata is stored, and the memory blocks BLK3 to BLKz may be designated as memory blocks in which the general data is stored.

Here, the general data includes data stored in the cell array 110 in accordance with the write request from the host 20. For example, the general data may include text data, audio data, video data, data for executing arbitrary software, and the like.

Meanwhile, the metadata includes data stored in the cell array 110 irrespective of a request from the host 20. For example, the metadata may include data for managing the nonvolatile memory device 100.

Specifically, the metadata may include data that does not change after being programmed at the time of manufacturing of the nonvolatile memory device 100. As an example of such data, algorithm data required for operation of the nonvolatile memory device 100 or the controller 200, data required for initial operation of the nonvolatile memory device 100, data required for setting the operating environment of the memory device 100 or the controller 200 and the like may be adopted.

On the other hand, the metadata may include data that may be changed in the future for management of the nonvolatile memory device 100. As an example of such data, address mapping table data that stores a mapping relation between the logical address and the physical address, wear-leveling data, data for managing the bad memory block and the like may be adopted.

That is, the metadata may be stored only in desired (or, alternatively, predetermined) memory blocks BLK1 and BLK2 in which general data is not stored. Further, when there are several types of metadata, only one type of metadata may be stored in one memory block. For example, if the metadata includes a first type of metadata and a second type of metadata, the first type of metadata may be stored in a memory block BLK1, and the second type of metadata may be stored in the memory block BLK2.

However, as the number of string select lines SSL and word lines WL of the nonvolatile memory device 100 increases, the sizes of each of the plurality of memory blocks BLK1, BLK2, . . . , BLKz also increase. On the other hand, even if the sizes of the plurality of memory blocks BLK1, BLK2, . . . , BLKz increase, the size of the metadata may not increase. Therefore, if the size of the metadata does not increase but only the sizes of the plurality of memory blocks BLK1, BLK2, . . . , BLKz increase, the region wasted in the memory blocks BLK1 and BLK2 may increase. Hereinafter, the nonvolatile memory device 100 for reducing (or, alternatively, minimizing) a wasted region in the memory block will be described with reference to FIGS. 4 to 9.

Figure 4:
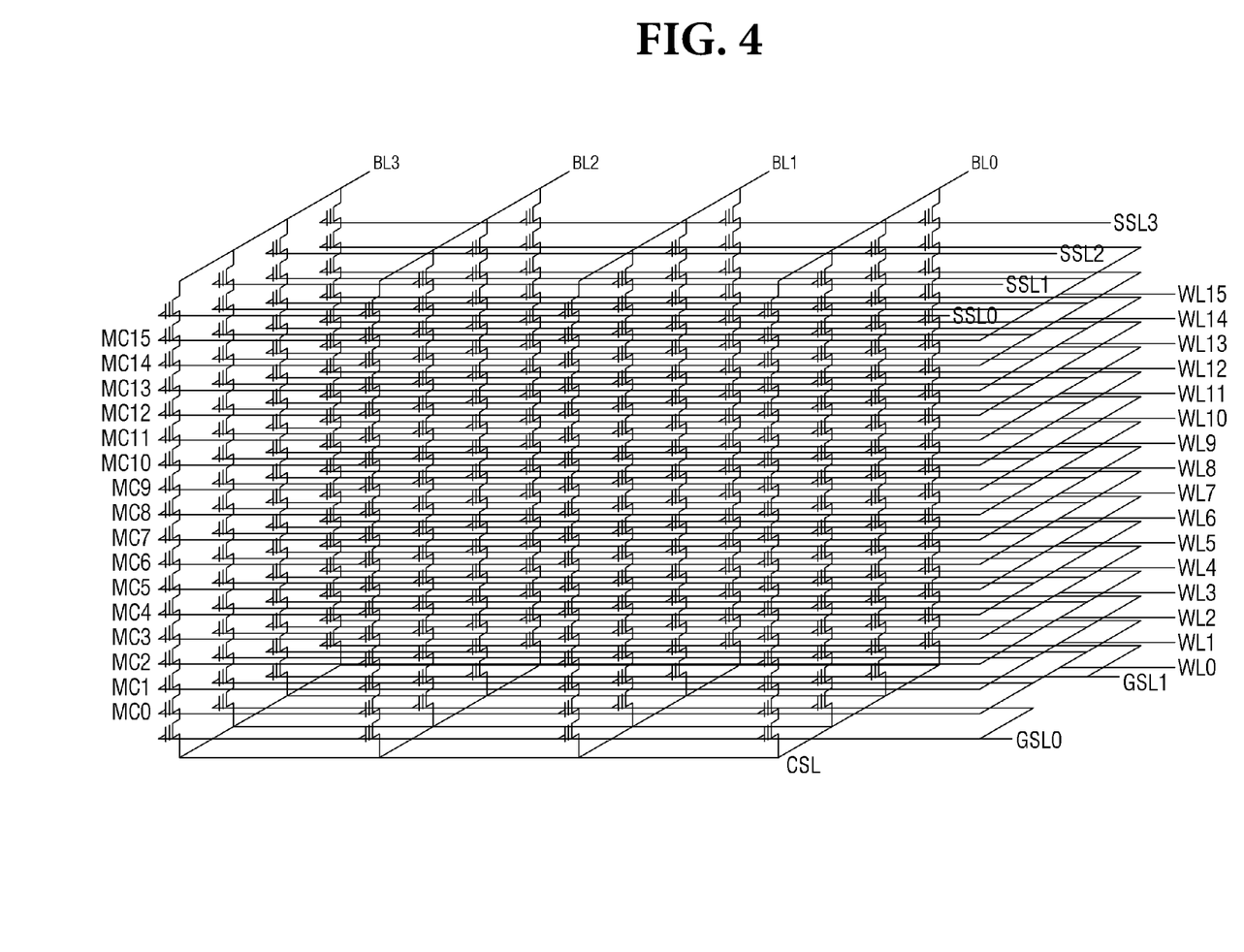
FIG. 4 is a circuit diagram illustrating one memory block of the memory cell of FIG. 3.

FIG. 4 is a circuit diagram illustrating the memory block of the memory cell of FIG. 3.

Referring to FIG. 4, a plurality of cell strings is formed between the bit line BL0 and a common source line CSL.

In an example embodiment, each of the cell strings includes a ground select transistor which is gated by the voltage of the ground select line GSL0 at a lowermost end, and includes a string select transistor gated by the voltage of the string select lines SSL0, SSL1, SSL2, and SSL3 at an uppermost end. The cell transistors disposed vertically between the ground select transistor and the string select transistor of the cell string are gated by the voltages of the word line WL0 to WL15, and operate as the memory cell in which data is stored.

In a similar structure, a plurality of cell strings is formed between the bit line BL1 and the common source line CSL. Similarly, a plurality of cell strings is also formed between the bit line BL2 and the common source line CSL, and between the bit line BL3 and the common source line CSL.

The cell strings of the same row share the string select line. Further, the cell strings of different rows are connected to the different string select lines, respectively. For example, when the string select line SSL0 is selected and the string select line SSL1 is not selected, the cell strings of the same row which share the string select line SSL0 are connected to the bit lines BL0, BL1, BL2 and BL3, and the cell strings of the same row which share the string select line SSL1 are electrically separated from the bit lines BL0, BL1, BL2 and BL3.

Further, when the bit lines BL0 and BL1 are selected and the bit lines BL2 and BL3 are not selected, the two columns connected to the bit lines BL0 and BL1 among the cell strings of the same row sharing the string select lines BL0, and BL1 may be selected, and the two columns connected to the bit lines BL2 and BL3 among the cell strings of the same row sharing the string select line SSL0 may not be selected.

Program and read operations of data may be executed in page units. That is, memory cells connected to the same word line among the cell strings connected to the same string select line may be programmed at a time and may be read at a time.

For example, if the cell string connected to the string select line SSL0 is selected, the program voltage is applied to the selected word line WL8 to WL11 and a non-selection voltage is applied to the unselected word lines WL0 to WL7 and WL12 to WL15, the threshold voltage of the memory cell gated to the voltage of the selected word lines WL8 to WL11 can change, and the data may be programmed in the memory cell.

As another example, if the cell strings connected to the string select line SSL1 are selected, a read voltage is applied to selected word lines WL4 to WL7, and a non-selection voltage is applied to the unselected word lines WL0 to WL3, and WL8 to WL15, the data stored in the memory cell gated to the voltage of the selected word lines WL4 to WL7 may be read.

The erase operation of data may be performed on a memory block basis. That is, the data of the memory cell gated to the voltage of the word lines WL0 to WL15 may be erased at a time.

Furthermore, the nonvolatile memory device 100 according to various example embodiments of the present disclosure supports a partial erase operation. For example, data of the memory cell gated to the voltage of the word lines WL0 to WL7 may be erased at a time, and the data of the memory cell gated to the voltage of the word lines WL8 to WL15 may be erased at a time.

Figure 5:
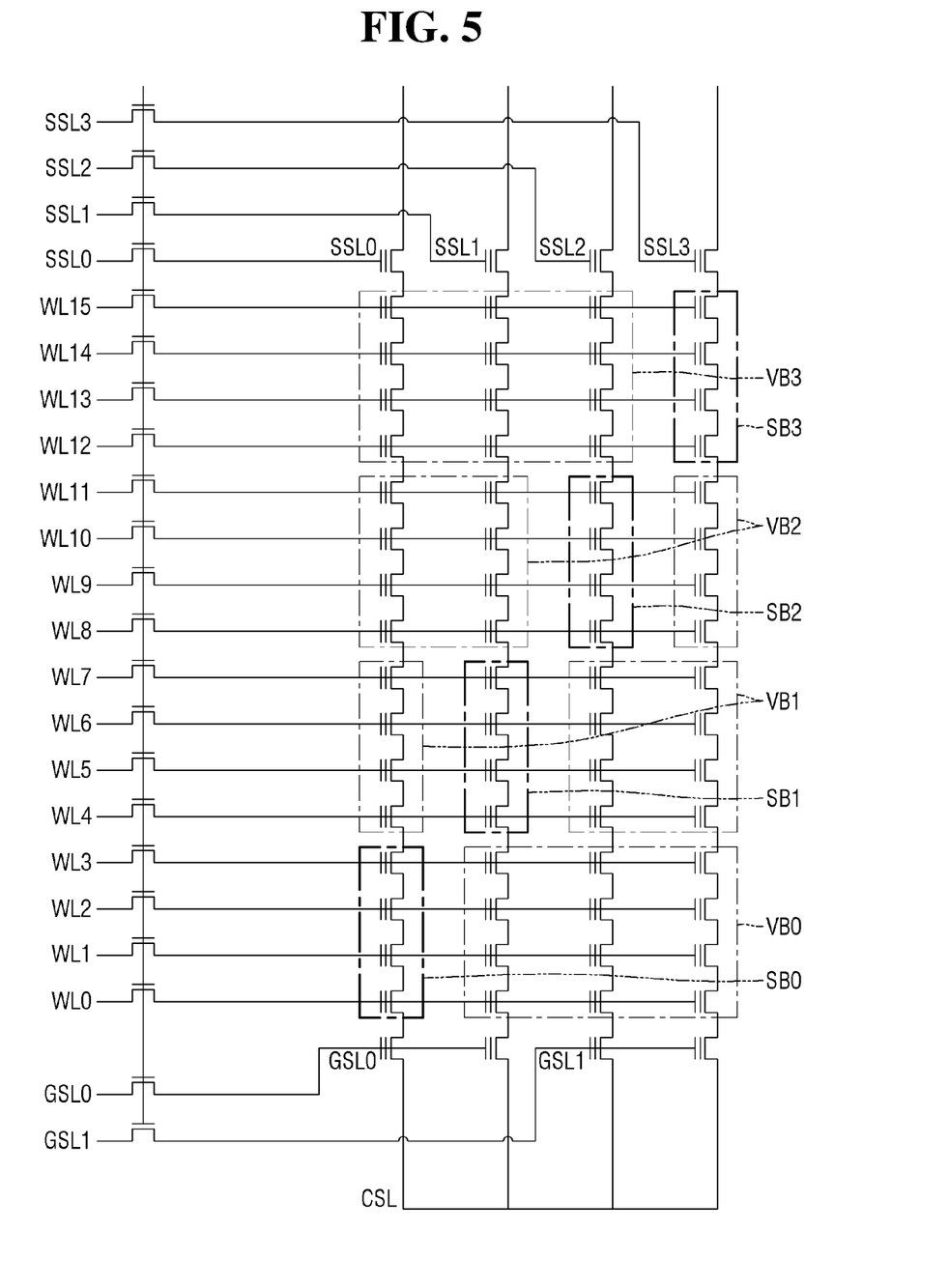
FIG. 5 is a circuit diagram illustrating a memory block of a nonvolatile memory device according to an example embodiment of the present disclosure.

FIG. 5 is a circuit diagram illustrating the memory block of the nonvolatile memory device according to an example embodiment of the present disclosure. FIG. 5 corresponds to a side view of the three-dimensional structure of FIG. 4 as viewed from the side surface. That is, FIG. 5 illustrates four string select transistors and four ground select transistors connected to the bit line BL0 of FIG. 4, and the cell transistor disposed between the string select transistors and the ground select transistors.

Referring to FIG. 5, the memory block of the nonvolatile memory device 100 according to an embodiment of the present disclosure includes a plurality of sub-blocks SB0, SB1, SB2 and SB3.

The first sub-block SB0 is defined by the first string select line SSL0 and the first word lines WL0 to WL3.

The second sub-block SB1 is defined by a second string select line SSL1 different from the first string select line SSL0, and second word lines WL4 to WL7 different from the first word lines WL0 to WL3.

The third sub-block SB2 is defined by a third string select line SSL2 different from the first string select line SSL0 and the second string select line SSL1, and third word line WL8 to WL11 different from the first word lines WL0 to WL3 and the second word lines WL4 to WL7.

The fourth sub-block SB3 is defined by a fourth string select line SSL3 different from the first string select line SSL0 to the third string select line SSL2, and fourth word lines WL12 to WL15 different from the first word lines WL0 to WL3 and the third word lines WL8 to WL11.

That is, the memory block of the nonvolatile memory device 100 according to one example embodiment of the present disclosure may include a plurality of sub-blocks SB0, SB1, SB2 and SB3 that does not share the string select line and the word line in a single physical block.

On the other hand, a plurality of vacant blocks VB0, VB1, VB2 and VB3 may be defined between the plurality of sub-blocks SB0, SB1, SB2 and SB3. For example, between the first sub-block SB0 defined by the first string select line SSL0 and the first word lines WL0 to WL3 and the second sub-block SB1 defined by the second string select line SSL1 and the second word lines WL4 to WL7, a first vacant block VB1 defined by the first string select line SSL0 and the second word line WL4 to WL7, and a second vacant block VB0 defined by the second string select line SSL1 and the first word lines WL0 to WL3 may be defined. In other words, the first vacant block VB0 may be defined so that it does not share the string select line but shares only the word line with the first sub-block SB0, and the second vacant block VB1 may be defined so that it does not share the string select line 2 but shares only the word line with the second sub-block SB1. In this manner, a plurality of vacant blocks VB0, VB1, VB2 and VB3 as illustrated in FIG. 5 may be defined.

Data may be programmed in the plurality of sub-blocks SB0, SB1, SB2 and SB3. In other words, the control logic 140 of the nonvolatile memory device 100 is defined in one memory block, and may program the data in the plurality of sub-blocks SB0, SB1, SB2 and SB3 that does not share the string select line and the word line each other.

In particular, the control logic 140 may program different types of data in each of the plurality of sub-blocks SB0, SB1, SB2 and SB3. For example, the first data is programmed in the first sub-block SB0, and the second data may be programmed in the second sub-block SB1. In particular, the first data may include a first type of metadata, and the second data may include a second type of metadata that is different from the first type.

On the other hand, data may not be programmed in the plurality of vacant blocks VB0, VB1, VB2 and VB3. In other words, the control logic 140 of the nonvolatile memory device 100 may not program data in the plurality of vacant blocks VB0, VB1, VB2 and VB3.

In some example embodiments of the present disclosure, the plurality of vacant blocks VB0, VB1, VB2 and VB3 may be kept in an erased state. Alternatively, in some other example embodiments of the present disclosure, the plurality of vacant blocks VB0, VB1, VB2 and VB3 may not be kept in the erased state.

Each of the plurality of sub-blocks SB0, SB1, SB2 and SB3 may be partially erased. That is, the control logic 140 of the nonvolatile memory device 100 may partially erase each of the plurality of sub-blocks SB0, SB1, SB2 and SB3.

For example, the first data programmed in the first sub-block SB0 and the second data programmed in the second sub-block SB1 may be independently and partially erased. Specifically, it is possible to erase the data of the selected memory cell at a time, by selecting the cell string connected to the string select line SSL0 and by selecting the word lines WL0 to WL3. Further, it is possible to erase the data of the selected memory cell at a time, by selecting the cell strings connected to the string select line SSL1 and by selecting the word lines WL5 to WL7.

In this way, by operating one physical block by dividing it into a plurality of sub-blocks SB0, SB1, SB2 and SB3, it is possible to reduce (or, alternatively, minimize) the wasted regions in the memory block with an increase in the size of the memory block. Furthermore, by executing the partial erase for each of the sub-blocks SB0, SB1, SB2 and SB3, the efficiency of the erase operation may also be improved.

Figure 6:
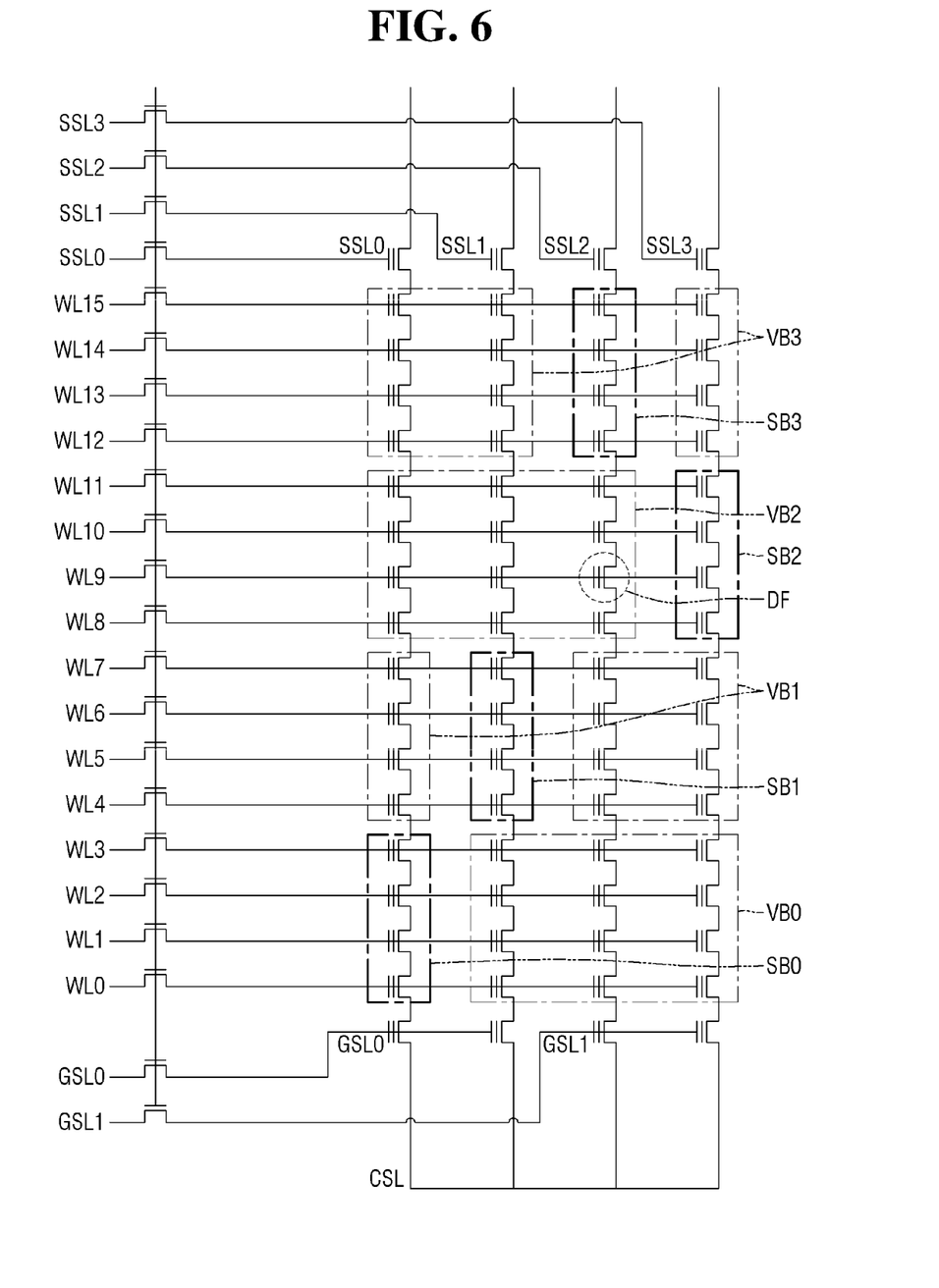
FIG. 6 is a circuit diagram illustrating the memory block of the nonvolatile memory device according to an example embodiment of the present disclosure.

FIG. 6 is a circuit diagram illustrating the memory block of the nonvolatile memory device according to an example embodiment of the present disclosure.

Referring to FIG. 6, a case where a defect DF occurs in the word line WL9 may be considered. In such a case, the memory block of the nonvolatile memory device 100 according to an example embodiment of the present disclosure may include the first sub-block SB0 defined by the first string select line SSL0 and the first word lines WL0 to WL3, the second sub-block SB1 defined by the second string select line SSL1 and the second word line WL4 to WL7, the third sub-block SB2 defined by the fourth string select line SSL3 and the third word lines WL8 to WL11, and the fourth sub-block SB3 defined by the third string select line SSL2 and the fourth word lines WL12 to WL15.

A plurality of vacant blocks VB0, VB1, VB2 and VB3 may be defined between the plurality of sub-blocks SB0, SB1, SB2 and SB3.

That is, in the memory block of the nonvolatile memory device 100 according to an example embodiment of the present disclosure, within one physical block, a region in which a defect DF occurs is defined as a vacant block, and a plurality of sub-blocks SB0, SB1, SB2 and SB3 which does not share the string select line and the word line in the remaining regions may be defined.

As a result, it is possible to further improve the use efficiency of the memory block, by dividing the physical block in which the defect exists into a plurality of sub-blocks SB0, SB1, SB2 and SB3 and performing the normal operation.

Furthermore, if there is a defect DF in the defined sub-block, the data may also be programmed in other sub-blocks.

For example, referring again to FIG. 5, if there is a defect in the first sub-block SB0 defined by the first string select line SSL0 and the first word lines WL0 to WL3, the data may be programmed in the third sub-block SB2 defined by the third string select line SS2 different from the first string select line SSL0, and the third word lines WL8 to WL11 different from the first word lines WL0 to WL3.

In this case, if another type of metadata is stored in the third sub-block SB2 and the fourth sub-block SB3 defined by the second string select line SSL2 and the fourth word lines WL12 to WL15 is vacant, the data may be programmed in the fourth sub-block SB3.

At this time, in some example embodiments of the present disclosure, if there is a defect in the first sub-block SB0, the memory cell gated by the word line in which the defect exists, among the word lines defining the first sub-block SB0 may be kept in an erased state.

As a result, even if a defect occurs in some of the plurality of sub-blocks SB0, SB1, SB2 and SB3, it is possible to further improve the use efficiency of the memory block by normally operating the sub-block as much as possible.

Furthermore, the example embodiments of the case where the above-described defect DF exists may be similarly applied to a case where a part of the memory cell 110 is degraded. In other words, it is possible to further improve the use efficiency of the memory block, by dividing one physical block which is partially degraded into a plurality of sub-blocks SB0, SB1, SB2 and SB3 and normally operating the block, and by programming the data in another sub-block when the partial degradation occurs in the predefined sub-block.

Figure 7:
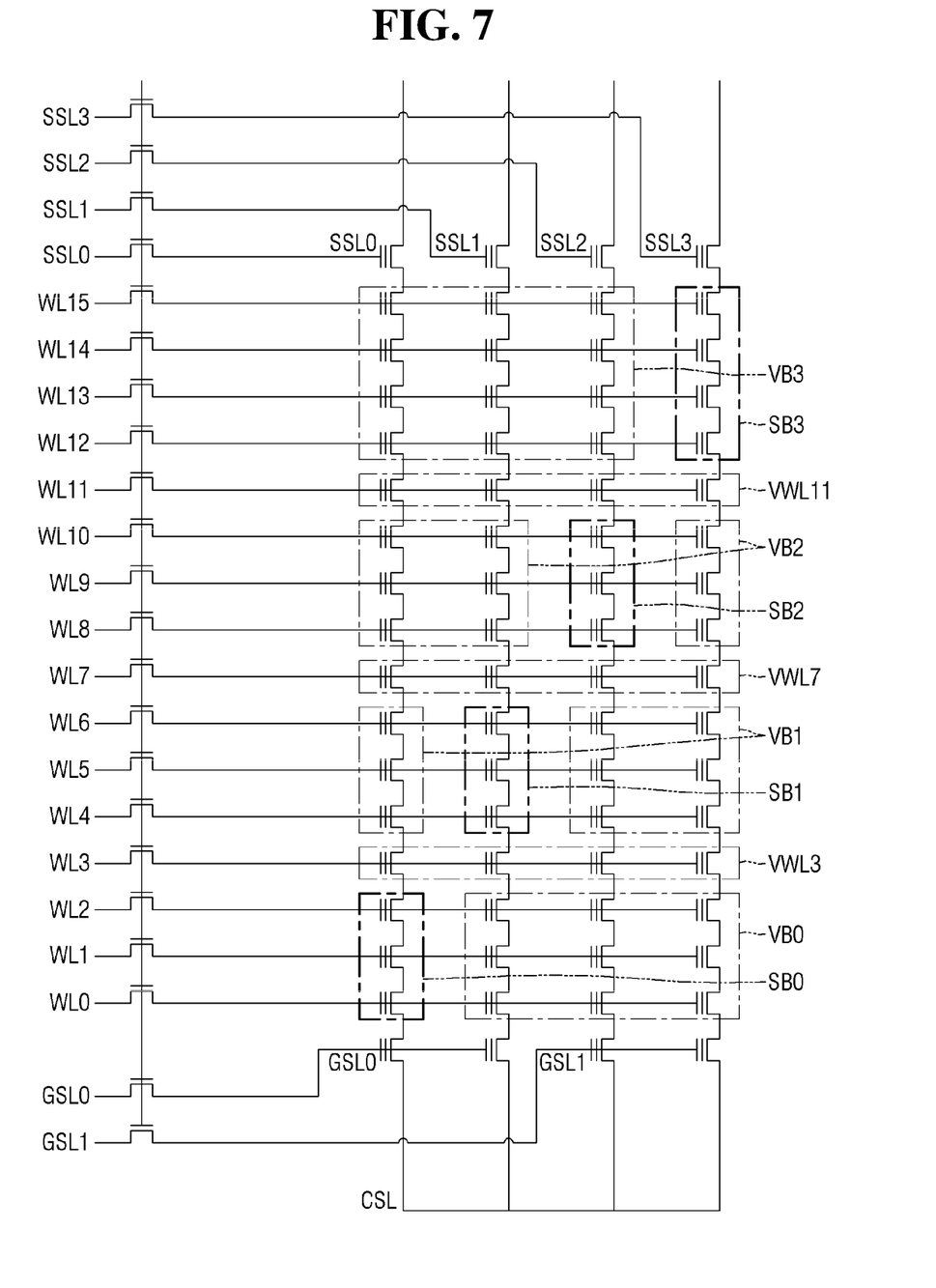
FIG. 7 is a circuit diagram illustrating the memory block of the nonvolatile memory device according to an example embodiment of the present disclosure.

FIG. 7 is a circuit diagram illustrating the memory block of the nonvolatile memory device according to an example embodiment of the present disclosure.

Referring to FIG. 7, vacant word lines VWL3, VWL7 and VWL11 may be defined between the plurality of sub-blocks SB0, SB1, SB2 and SB3.

Specifically, the memory block of the nonvolatile memory device 100 according to an example embodiment of the present disclosure may include a first sub-block SB0 defined by the first string select line SSL0 and the first word lines WL0 to WL2, a second sub-block SB1 defined by the second string select line SSL1 and the second word lines WL4 to WL6, a third sub-block SB2 defined by the third string select line SSL2 and the third word lines WL8 to WL10, and a fourth sub-block SB3 defined by the fourth string line SSL3 and the fourth word lines WL12 to WL15.

Further, the memory block may further include a first vacant word line VWL3 between the first sub-block SB0 and the second sub-block SB1. The memory block may further include a second vacant word line VWL7 between the second sub-block SB1 and the third sub-block SB2, and may further include a third vacant word line VWL11 between the third sub-block SB2 and the fourth sub-block SB3.

By defining the vacant word lines VWL3, VWL7 and VWL11 between the plurality of sub-blocks SB0, SB1, SB2 and SB3, it is possible to reduce (or, alternatively, minimize or prevent) a disturbance phenomenon in which the memory cells not selected are also programmed at the time of the program operation.

In the present example embodiment, the vacant word line is represented by one word line. However, in another example embodiment of the present disclosure, the vacant word line may be defined to include two or more word lines.

Figure 8:
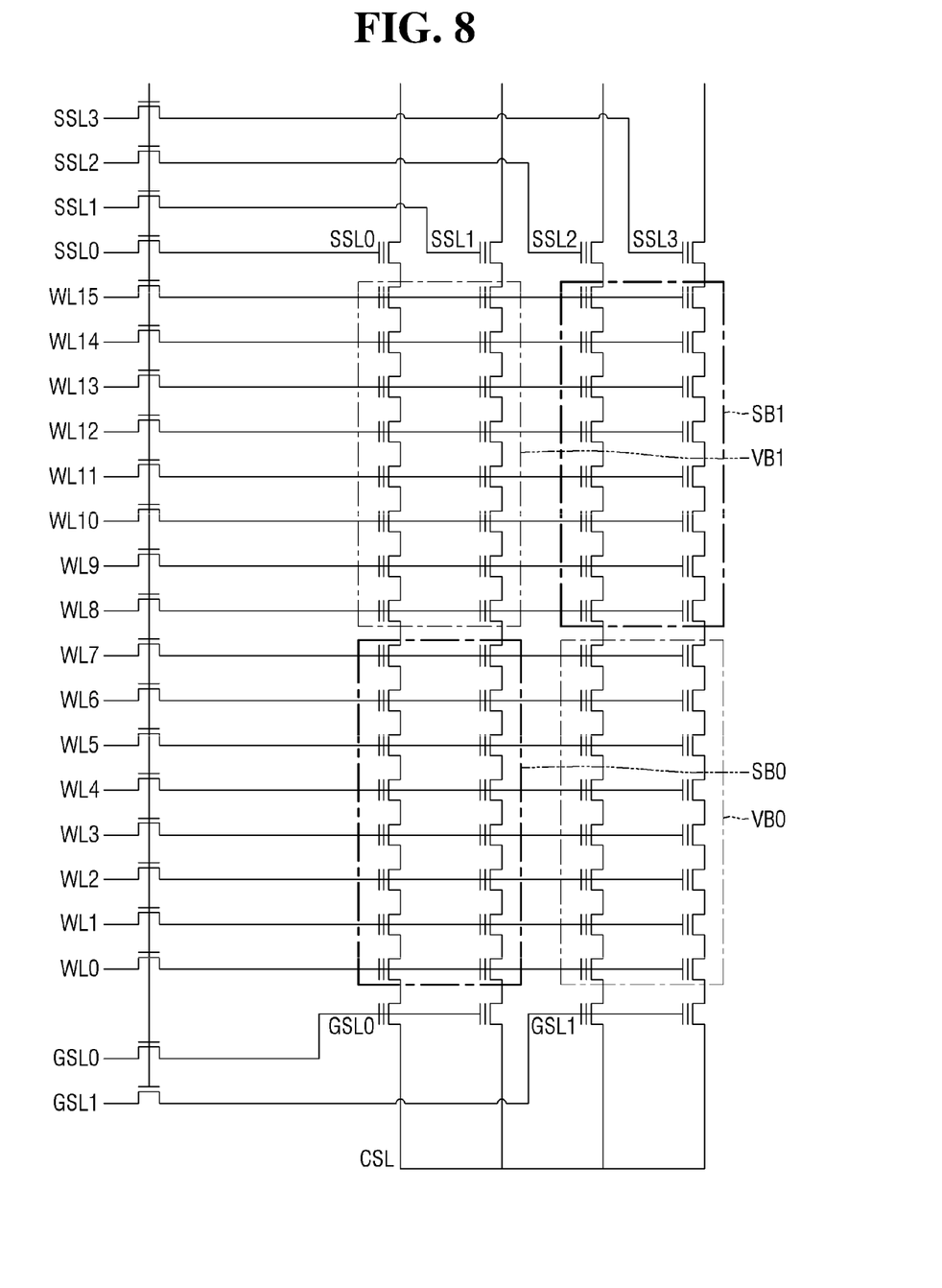
FIG. 8 is a circuit diagram illustrating the memory block of the nonvolatile memory device according to an example embodiment of the present disclosure.

FIG. 8 is a circuit diagram illustrating the memory block of the nonvolatile memory device according to an example embodiment of the present disclosure.

Referring to FIG. 8, the memory block of the nonvolatile memory device 100 according to an example embodiment of the present disclosure includes a plurality of sub-blocks SB0 and SB1.

The first sub-block SB0 is defined by the first string select lines SSL0 and SSL1 and the first word lines WL0 to WL7.

The second sub-block SB1 is defined by second string select lines SSL2 and SSL3 different from the first string select lines SSL0 and SSL1, and second word lines WL8 to WL15 different from the first word lines WL0 to WL7.

In other words, the memory block of the nonvolatile memory device 100 according to the example embodiment of the present disclosure may include a plurality of sub-blocks SB0 and SB1 which does not share the string line and the word line each other in a single physical block. At this time, each of the plurality of sub-blocks SB0 and SB1 may include a plurality of string select lines.

On the other hand, a plurality of vacant blocks VB0 and VB1 may be defined between the plurality of sub-blocks SB0 and SB1. For example, between the first sub-block SB0 defined by the first string select lines SSL0 and SSL1 and the first word lines WL0 to WL7, and the second sub-block SB1 defined by the second string select lines SSL2 and SSL3 and the second word lines WL8 to WL15, the first vacant block VB1 defined by the first string select lines SSL0 and SSL1 and the second word lines WL8 to WL15, and the second vacant block VB0 defined by the second string select lines SSL2 and SSL3 and the first word lines WL0 to WL7 may be defined. In other words, the first vacant block VB0 may be defined to not share the string select line but share only the word line with the first sub-block SB0, and the second vacant block VB1 may be defined to not share the string select line and share only the word line with the second sub-block SB1.

Data may be programmed in the plurality of sub-blocks SB0 and SB1. In particular, different types of data may be programmed for each of the plurality of sub-blocks SB0 and SB1. For example, the first data may be programmed in the first sub-block SB0, and the second data may be programmed in the second sub-block SB1. In particular, the first data may include a first type of metadata, and the second data may include a second type of metadata that is different from the first type.

On the other hand, data may not be programmed in the plurality of vacant blocks VB0 and VB1. In some example embodiments of the present disclosure, the plurality of vacant blocks VB0 and VB1 may be kept in an erased state. Alternatively, in some other embodiments of the present disclosure, the plurality of vacant blocks VB0 and VB1 may not be kept in the erased state.

Each of the plurality of sub-blocks SB0 and SB1 may be partially erased. That is, the control logic 140 of the non-volatile memory device 100 may partially erase each of the plurality of sub-blocks SB0 and SB1.

For example, the first data programmed in the first sub-block SB0 and the second data programmed in the second sub-block SB1 may be independently and partially erased. Specifically, the data of the selected memory cell may be erased at a time, by selecting the cell string connected to the string select lines SSL0 and SSL1 and selecting the word lines WL0 to WL7. Further, the data of the selected memory cells may be erased at a time, by selecting the cell strings connected to the string select lines SSL2 and SSL3 and selecting the word lines WL8 to WL15.

In this way, by operating one physical block by dividing it into a plurality of sub-blocks SB0 and SB1, wasted regions in the memory block with an increase in the size of the memory block may be reduced (or, alternatively, minimized). Furthermore, by executing the partial erase for each of the sub-blocks SB0 and SB1, the efficiency of the erase operation may also be improved.

Figure 9:
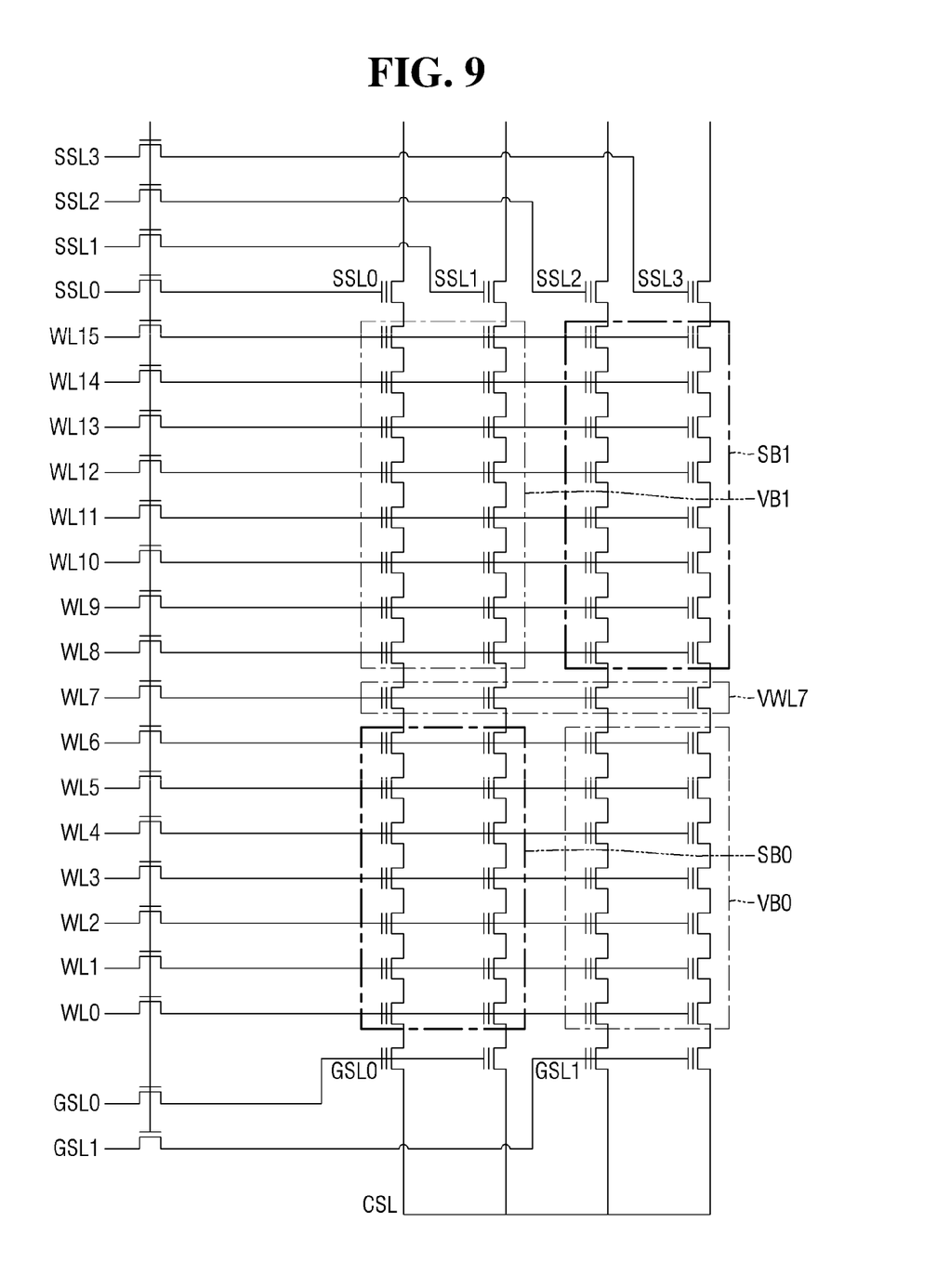
FIG. 9 is a circuit diagram illustrating the memory block of the nonvolatile memory device according to an example embodiment of the present disclosure.

FIG. 9 is a circuit diagram illustrating the memory block of the nonvolatile memory device according to an example embodiment of the present disclosure.

Referring to FIG. 9, a vacant word line VWL7 may be defined between a plurality of sub-blocks SB0 and SB1.

Specifically, the memory block of the nonvolatile memory device 100 according to an example embodiment of the present disclosure may include the first sub-block SB0 defined by the first string select lines SSL0 and SSL1 and the first word lines WL0 to WL6, and the second sub-block SB1 defined by the second string select lines SSL2 and SSL3 and the second word lines WL8 to WL15.

The memory block may further include the vacant word line VWL7 between the first sub-block SB0 and the second sub-block SB1.

By defining the vacant word line VWL7 between the plurality of sub-blocks SB0 and SB1, it is possible to reduce (or, alternatively, minimize or prevent) the disturbance phenomenon in which the memory cell not selected is also programmed at the time of the program operation.

In the present example embodiment, the vacant word line is represented by one word line. However, in another example embodiment of the present disclosure, the vacant word line may be defined to include two or more word lines.

Figure 10:
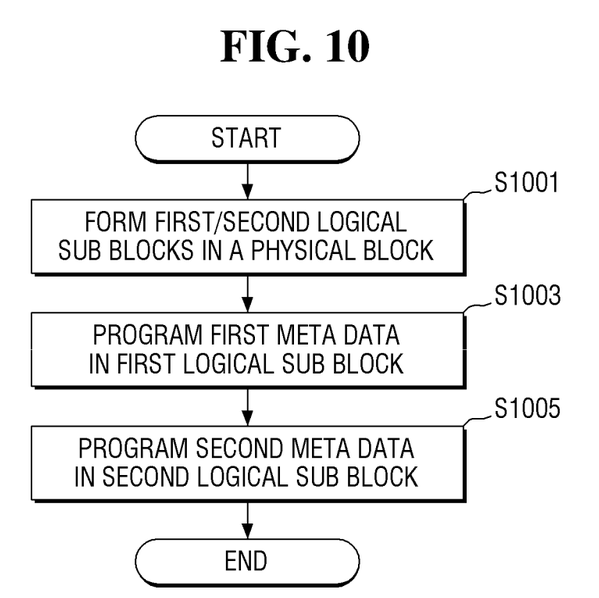
FIG. 10 is a flowchart illustrating a method of operation a nonvolatile memory device according to an example embodiment of the present disclosure.

FIG. 10 is a flowchart illustrating a method of operating the nonvolatile memory device according to an example embodiment of the present disclosure.

Referring to FIG. 10, the method of operating the nonvolatile memory device according to an embodiment of the present disclosure includes defining (S1001) the first sub-block and the second sub-block such that the second sub-bock does not share the string select line and the word line with the first sub-block, in one physical block.

Further, the method includes programming (S1003) first data (i.e., first type of metadata) in the first sub-block.

Further, the method includes programming (S1005) second data (i.e., second type of metadata) in the second sub-block.

Figure 11:
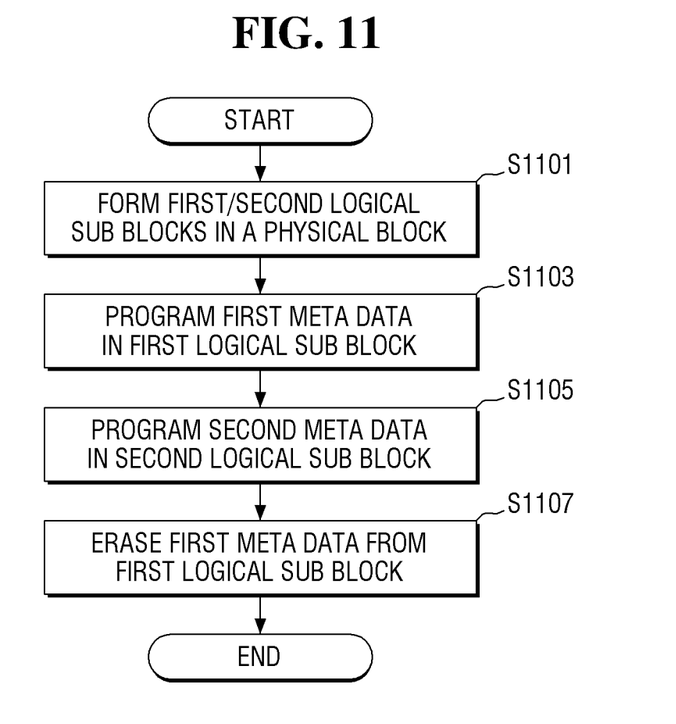
FIG. 11 is a flowchart illustrating the method of operating the nonvolatile memory device according to an example embodiment of the present disclosure.

FIG. 11 is a flowchart illustrating the method of operating the nonvolatile memory device according to an example embodiment of the present disclosure.

Referring to FIG. 11, the method of operating the nonvolatile memory device according to an example embodiment of the present disclosure includes defining (S1101) the first sub-block and the second sub-block such that the second sub-block does not share the string select line and the word line with first sub-block, in a single physical block.

Further, the method includes programming (S1103) the first data (i.e., the first type of metadata) in the first sub-block.

Further, the method includes programming (S1105) the second data (i.e., the second type of metadata) in the second sub-block.

Also, the method includes individual and partial erasing (S1107) of the first data programmed in the first sub-block and the second data programmed in the second sub-block.

Figure 12:
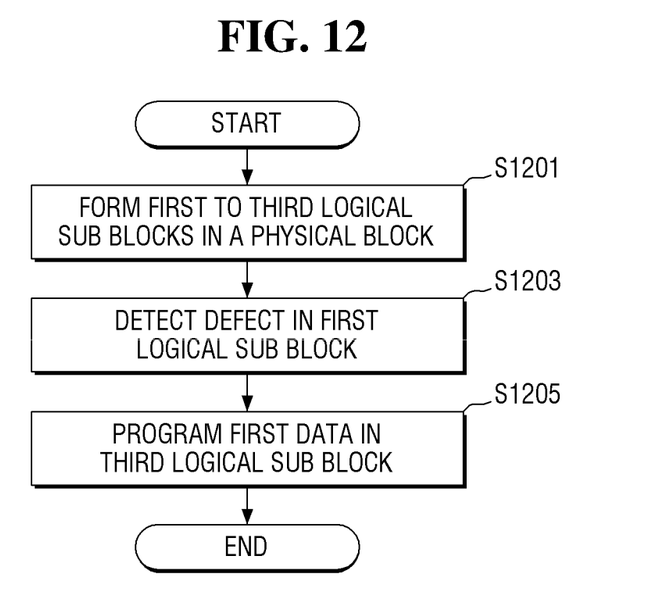
FIG. 12 is a flowchart illustrating the method of operating the nonvolatile memory device according to an example embodiment of the present disclosure.

FIG. 12 is a flowchart illustrating the method of operating the nonvolatile memory device according to an example embodiment of the present disclosure.

Referring to FIG. 12, the method of operating the nonvolatile memory device according to an embodiment of the present disclosure includes defining (S1201) the first sub-block, the second sub-block, and the third sub-block such that the second sub-block does not share the string select line and the word line with the first sub-block, and the third sub-block does not share the string select line and the word line with the first sub-block and the second sub-block, in a single physical block.

Further, the method includes detecting (S1203) a defect in the first sub-block.

Also, the method includes programming (S1205) the first data in the third sub-block.

According to the various example embodiments of the present disclosure explained above, by operating one physical block of the nonvolatile memory device by dividing the physical block into a plurality of sub-blocks, it is possible to reduce (or, alternatively, minimize) the wasted region in the memory block as the size of the memory block increases. Furthermore, by executing the partial erasing for each sub-block, the efficiency of the erase operation may also be improved.

Further, even if defect or degradation occurs in some of a plurality of sub-blocks, it is possible to further improve the use efficiency of the memory block by normally operating the sub-block as much as possible.

The units and/or devices described above, such as the components of the memory device (e.g., 10) including the controller (e.g., 200) and the nonvolatile memory device (e.g., 100) as well as the sub-components thereof including the control logic circuit (e.g., 140) may be implemented using hardware, a combination of hardware and software, or a non-transitory storage medium storing software that is executable to perform the functions of the same.

Hardware may be implemented with various hardware devices, such as integrated circuits (ICs), application specific ICs (ASICs), field programmable gate array (FPGAs), complex programmable logic device (CPLDs), system on chips (SoCs) or processing circuity such as one or more Central Processing Units (CPUs), one or more controllers, one or more arithmetic logic units (ALUs), one or more digital signal processors (DSPs), one or more microcomputers, or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein.

The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

In concluding the detailed description, those skilled in the art will appreciate that many variations and modifications may be made to the example embodiments discussed above without substantially departing from the principles of the example embodiments. Therefore, the disclosed example embodiments of the disclosure are used in a generic and descriptive sense only and not for purposes of limiting the example embodiments.

What is claimed is:

1. A nonvolatile memory device comprising:
a first sub-block defined by a first string select transistor connected to a first string select line and a first word line, the first sub-block configured to store first data therein;
a second sub-block defined by a second string select transistor connected to a second string select line and a second word line, the second string select line and the second word line being different from the first string select line and the first word line, respectively, the second sub-block configured to store second data therein;
a first vacant block defined by the first string select line, and the second word line; and
a second vacant block defined by the second string select line, and the first word line, wherein
each of the first vacant block and the second vacant block are configured to not store data therein,
the first sub-block and the first vacant block are connected to each other in series between the first string select transistor and a common source line, and
the second sub-block and the second vacant block are connected to each other in series between the second string select transistor and the common source line.

2. The nonvolatile memory device of claim 1, wherein the nonvolatile memory device is configured to maintain the first vacant block and the second vacant block in an erased state.

3. The nonvolatile memory device of claim 1, wherein the nonvolatile memory device is configured to maintain the first vacant block and the second vacant block in an unerased state.

4. The nonvolatile memory device of claim 1, wherein
each of the first string select line and the second string select line includes one or more string select lines, and
each of the first word line and the second word line includes one or more word lines.

5. The nonvolatile memory device of claim 1, further comprising:
a vacant word line between the first sub-block and the second sub-block.

6. The nonvolatile memory device of claim 5, wherein the vacant word line includes one or more word lines.

7. The nonvolatile memory device of claim 1, wherein the nonvolatile memory device is configured to independently and partially erase the first data programmed in the first sub-block and the second data programmed in the second sub-block.

8. The nonvolatile memory device of claim 1, wherein the first sub-block and the second sub-block are included in a single physical block.

9. The nonvolatile memory device of claim 1, wherein
the first data includes metadata of a first type, and
the second data includes metadata of a second type, the second type being different from the first type.

10. The nonvolatile memory device of claim 1, further comprising:
a third sub-block defined by a third string select line and a third word line, the third string select line and the third word line being different from the first string select line and the first word line, respectively, wherein
the nonvolatile memory device is configured to program the first data in the third sub-block when a defect exists in the first sub-block.

11. The nonvolatile memory device of claim 10, wherein the nonvolatile memory device is configured to maintain a memory cell gated by a word line among the first word line defining the first sub-block in an erased state, when the defect exists in the first sub-block.

12. A nonvolatile memory device comprising:
a control logic which controls an address decoder and a read/write logic; and
a cell array including a plurality of memory blocks,
the control logic configured to,
program first data in a first sub-block defined in one memory block among the plurality of memory blocks, and
program second data in a second sub-block defined in the one memory block such that the second sub-block does not share a string select line and a word line with the first sub-block,
wherein the one memory block further includes,
   a first vacant block defined in the one memory block such that the first vacant block shares the string select line with the first sub-block and does not share the word line with the first sub-block; and
   a second vacant block defined in the one memory block such that the second vacant block shares a second string select line with the second sub-block and does not share a second word line with the second sub-block,
wherein the first sub-block and the first vacant block are connected to each other in series between a string select transistor connected to the string select line and a common source line, and
wherein the second sub-block and the second vacant block are connected to each other in series between a second string select transistor connected to the second string select line and the common source line.

13. The nonvolatile memory device of claim 12, wherein the control logic is configured to not program data in the first vacant block and the second vacant block.

14. The nonvolatile memory device of claim 12, wherein the one memory block further comprises:
   a vacant word line between the first sub-block and the second sub-block.

15. The nonvolatile memory device of claim 12, wherein the control logic is configured to independently and partially erase the first data programmed in the first sub-block and the second data programmed in the second sub-block.

16. The nonvolatile memory device of claim 12, wherein the first data includes metadata of a first type, and
the second data includes metadata of a second type different from the first type.

17. A method of operating a nonvolatile memory device, the method comprising:
   defining a first sub-block and a second sub-block in one physical block such that the second sub-block does not share a word line and a string select line with the first sub-block;
   programming first data in the first sub-block; and
   programming second data in the second sub-block,
   wherein the one physical block further includes,
      a first vacant block defined in the one physical block such that the first vacant block shares the string select line with the first sub-block and does not share the word line with the first sub-block; and
      a second vacant block defined in the one physical block such that the second vacant block shares a second string select line with the second sub-block and does not share a second word line with the second sub-block,
   wherein the first sub-block and the first vacant block are connected to each other in series between a string select transistor connected to the string select line and a common source line, and
   wherein the second sub-block and the second vacant block are connected to each other in series between a second string select transistor connected to the second string select line and the common source line.

18. The method of claim 17, wherein the first sub-block and the second sub-block are defined such that a vacant word line is therebetween.

19. The method of claim 17, further comprising:
   independently and partially erasing the first data programmed in the first sub-block and the second data programmed in the second sub-block.

* * * * *